United States Patent [19]

Brennesholtz

[11] Patent Number: 5,389,397
[45] Date of Patent: Feb. 14, 1995

[54] METHOD FOR CONTROLLING THE THICKNESS DISTRIBUTION OF A DEPOSITED LAYER

[75] Inventor: Matthew S. Brennesholtz, Waterloo, N.Y.

[73] Assignee: North American Philips Corporation, New York, N.Y.

[21] Appl. No.: 846,727

[22] Filed: Mar. 4, 1992

Related U.S. Application Data

[63] Continuation of Ser. No. 400,198, Aug. 29, 1989, abandoned.

[51] Int. Cl.$^6$ .............................................. B05D 5/06
[52] U.S. Cl. ................................. 427/69; 427/64; 427/166; 427/167; 427/282; 427/237; 427/255.5; 427/251; 118/730
[58] Field of Search ............... 427/64, 69, 282, 237, 427/166, 167, 294, 255.5, 251; 118/715, 720, 730

[56] References Cited

U.S. PATENT DOCUMENTS

| | | | |
|---|---|---|---|
| 3,617,331 | 11/1971 | Illsley et al. | 117/33.3 |
| 3,617,339 | 11/1971 | Kiwiet | 117/38 |
| 3,799,792 | 3/1974 | Rying | 117/43 |
| 4,269,874 | 5/1981 | Pryor et al. | 427/282 |
| 4,273,812 | 6/1981 | Tsutsui et al. | 427/248.1 |
| 4,303,489 | 12/1981 | Morrison, Jr. | 204/192 R |
| 4,536,419 | 8/1985 | Kubota et al. | 427/255.5 |
| 4,704,306 | 11/1987 | Nakamura | 427/100 |

FOREIGN PATENT DOCUMENTS 53-39862 10/1978 Japan.

*Primary Examiner*—Roy V. King
*Attorney, Agent, or Firm*—John C. Fox

[57] ABSTRACT

The thickness distribution of a vapor deposited layer such as an interference filter deposited on a substrate such as a glass faceplate for a projection television tube, is controlled in the plane of the substrate by employing at least one variable transmission mark to partially shield the substrate during deposition.

3 Claims, 1 Drawing Sheet

METHOD FOR CONTROLLING THE THICKNESS DISTRIBUTION OF A DEPOSITED LAYER

This is a continuation of application Ser. No. 400,198, filed Aug. 29, 1989, now abandoned.

CROSS REFERENCE TO RELATED APPLICATION

Copending U.S. patent application Ser. No. 340,835, filed Apr. 20, 1989, now U.S. Pat. No. 4,942,063, relates to a method and apparatus for controlling thickness distribution of an interference filter using a rotating dodger.

BACKGROUND OF THE INVENTION

This invention relates to layer deposition of material onto a substrate, and more particularly relates to a method and apparatus for controlling the thickness distribution of the deposited layers along the plane of the substrate.

U.S. Pat. No. 4,683,398 describes a cathode ray tube for projection color television having a multilayer interference filter between the glass face plate and the luminescent screen. Such a filter results, among other things, in significantly greater brightness of the luminescent output of the tube.

Such interference filters are typically composed of alternating layers of materials having a high and a low index of refraction, respectively. The layers are preferably formed by vapor deposition onto the inner surface of the glass face plate.

Mass production of such filters is carried out in a vacuum chamber containing the source materials to be evaporated, means for heating the source materials, and a dome-shaped fixture adapted for holding a multiplicity of glass face plates. The plates are arranged in rows, each row forming a circle around the dome, so that each plate is approximately equidistant with the other plates from the source materials.

The dome is rotated during deposition, not only to promote uniform distribution of the deposited material on the plates, but also to pass the plates behind one or more stationary dodgers located between the source materials and the plates. These dodgers are designed to result in increasing thickness of the layers toward the edges of the plates, which has been shown to result in even greater increases in brightness than can be obtained for a uniform thickness distribution.

Ideally, the thickness of the layers should increase in all directions from the center of the plate. Unfortunately, however, such an arrangement as described above can only be used to control thickness distribution in a direction normal to the direction of movement of the plates.

A method is known by which a radial thickness distribution can be achieved. This so called "planetary" method involves rotating each plate about an axis normal to the surface of the plate, while the plate passes behind the dodger as described above. However, in addition to adding to the complexity of the apparatus, the rotating plates require significantly more space in the dome than do stationary plates. Thus, the throughput of the apparatus is significantly reduced. Also, in the case of often-used skirted panels, the planetary drive is adequate only for circularly symmetric plates or "discs", and not for rectangular plates.

OBJECTS AND SUMMARY OF THE INVENTION

Accordingly, it is an object of the invention to control the thickness distribution of a deposited layer on a substrate in the plane of the substrate.

It is another object of the invention to control the thickness distribution in such plane without rotation of the substrate about an axis normal to the surface of the substrate or other movement of the substrate.

In accordance with one aspect of the invention, a method of controlling the thickness distribution of a deposited layer on a substrate comprises providing at least one variable transmission mask between the source material and the substrate so that during deposition the substrate is partially shielded from and partially exposed to the source material.

In accordance with a preferred embodiment of the method, a plurality of substrates, each with an associated variable transmission mask located between the substrate and the source material, are moved in circular paths above the source material, in order to enhance the uniformity of the deposition among the substrates.

In accordance with another aspect of the invention, an apparatus is provided for carrying out the above method, the apparatus comprising a vacuum chamber containing at least one source material and means for heating the source material to vaporize it, means for holding a plurality of substrates in positions approximately equidistant from the source material, and means for holding a plurality of variable transmission masks so that during deposition the substrates are at least partially shielded from and partially exposed to the source material.

In a preferred embodiment of the apparatus, means are provided for moving the substrates and masks, comprising a rotatably mounted dome-shaped fixture, the fixture adapted for holding the substrates and masks in one or more circular rows and for moving the substrates and masks in these circular rows above the source material.

DESCRIPTION OF THE PREFERRED EMBODIMENTS

Figure 1:
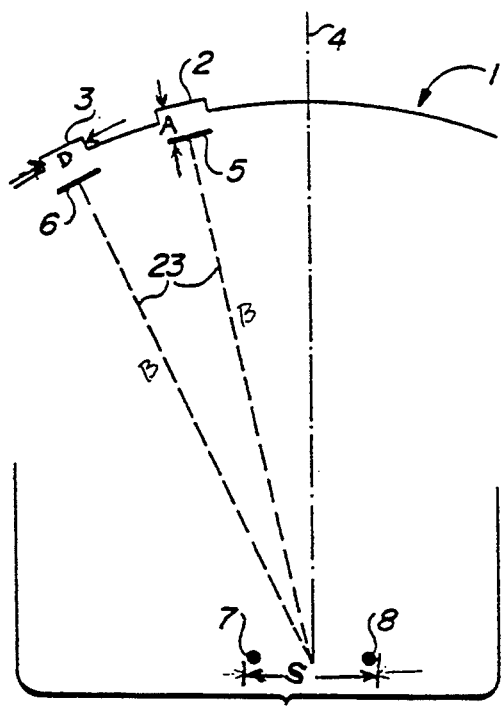
FIG. 1 is a diagrammatic representation of the positional relationship between source material, substrates and masks in one embodiment of a vapor deposition apparatus of the invention.

FIG. 1 shows the positional relationship between source material, substrates and variable transmission masks in a vapor deposition apparatus according to the invention. Dome-shaped fixture 1 holds substrates 2 and 3 in positions which are approximately equidistant from source materials 7 and 8. Fixture 1 rotates about an axis 4. Masks 5 and 6, fixed in position relative to substrates 2 and 3, shield substrates 2 and 3 respectively from the path of vapor from the source materials, while the rotating fixture moves the substrates and masks in a circular path above the source materials.

For example, if a mask with 70% open area at the center and 75% open area at the edge is used to dodge a flat substrate, the material thickness at the edge will be 75/70=1.07 times as thick as the material thickness at the center.

In the application envisioned for the invention, the substrates are glass face plates for cathode ray tubes for projection television, and the source materials are usually oxides of silicon and titanium or tantalum, which are deposited on the inner surfaces of the substrates in alternate layers. Oxidation is completed to form an interference filter of alternating layers of $SiO_2$ and $TiO_2$ or $SiO_2$ and $Ta_2O_3$, having low and high indices of refraction, respectively.

In this application, the ability to control the thickness distribution of the filter layers across the face plate enables the optimization of certain operating characteristics of the projection tubes such as lumen output to the projection optics.

Figure 2:
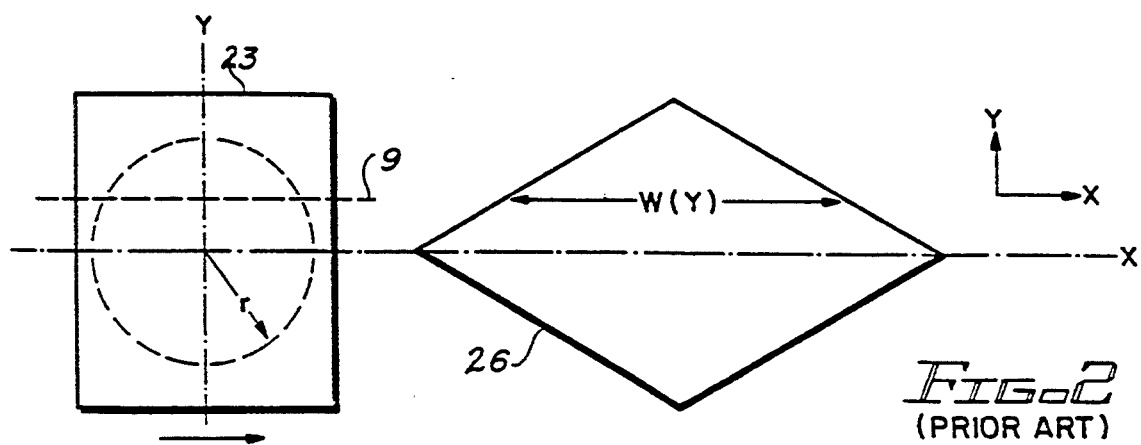
FIG. 2 is a diagrammatic representation viewed from the source of a substrate and fixed dodger arrangement of the prior art.

FIG. 2 shows a substrate and fixed dodger arrangement of the prior art as viewed from the position of the source materials. Substrate 23 is a glass face plate which is rectangular in shape. The long axis of the face plate is conventionally referred to as the major axis which in this Figure corresponds to the Y axis. The short axis is the minor axis and here corresponds to the X axis, which in an apparatus of the type shown in FIG. 1 represents the circular path of travel of the substrate caused by the rotation of fixture 1, as viewed in the plane of the circle.

Dodger 26 has a width W which varies as a function of distance Y from the X axis. As the substrate is moved behind the dodger, the substrate is shielded from the evaporation source and less material is deposited on the substrate than would otherwise be the case. If the dodger had approximately straight sides parallel to the Y axis, all of the substrate would be shielded for the same proportion of the time and the distribution of the deposited layer would not change. However, since the dodger width varies as a function of Y, the substrate exposure time also varies along the Y axis and the thickness of the deposit also changes.

Figure 3:
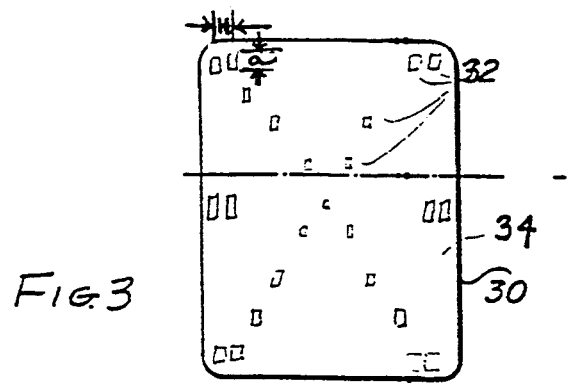
FIG. 3 is a diagrammatic representation of one embodiment of a variable transmission mask as viewed from the source in accordance with the invention.

It is not possible to control thickness along the minor axis with static dodgers of any geometry. In accordance with the invention, thickness along the plane of the substrate including the minor axis is controlled using a variable transmission mask. FIG. 3 shows one embodiment of such a mask 30 as viewed from the position of the source materials. Such a mask 30 is mounted between the source and substrate to move with the substrate along its circular path above the source materials.

The mask 30 would typically have a large number of small holes 32 chemically etched in a thin metal sheet 34. The mask would typically be as large as the substrate to be coated, more or less. The area of the mask corresponding to the area on the substrate where the greatest amount of material is to be deposited would typically have the largest transmission compatible with the structural integrity of the mask. For chemically etched masks with rectangular holes, this maximum transmission would typically be in the range of 70–90%. The areas where less material was desired would have a lower transmission. Transmission can be varied by varying the size of the holes, the shape of the holes or by varying the spacing between holes. Transmission is typically computed by averaging over an area including several holes.

Generalizing, the following relationship will be approximately true:

$$M'(x,y) = M(x,y) * T(x*(B/(A+B)), y*(B/(A+B)))$$

where
 $M(x,y)$ = the material thickness distribution across the plane of the substrate with no transmission mask;
 $M'$ = the actual distribution achieved;
 $T$ = the mask transmission;
 $A$ = the distance from the mask to the substrate;
 $B$ = the distance from the mask to the source; and
 $x=0$, $y=0$ represents the rotational axis 4 which passes through the center or centroid of the substrate, mask and source; and
where the following conditions are met:
1) the material travels in essentially straight lines, such that the thickness of the deposited layer at any point on the substrate results from material passing through the hole nearest that point as well as through neighboring holes;
2) The substrate is flat;
3) Substrate size $D << A+B$ (As used herein, the symbols $>>$ and $<<$ mean from 3 to 10 times greater and 3 to 10 times smaller, respectively unless otherwise noted);
4) Source size S and mask scale length H, defined as the center-to-center distance between aperturese (for an etched mask, H would typically be on the order of 20 mils, and the separation between apertures on the order of 2 mils) meet the following relationship:

$$A+B >> S >> ((A+B)/A)*H$$

5) Mean free path L of the material being deposited is $L >> A+B$;
6) The substrate and mask are parallel;
7) Mask aperture size a is much greater than particle size;
8) The minimum achievable feature size F is $<<D$, where F represents the smallest dimension over which a local thickness gradient can be produced, and is defined as the dimension over which the local average thickness (LAT) differs from either the local center thickness (LCT) or the total average thickness (TAT) by at least 0.25%, where: LAT is the average thickness over a dimension ($d<<D$ but $>H$) where d is typically about 1% of D; LCT is the thickness at the center or centroid of the substrate; and TAT is the mean thickness over the entire substrate.

When these conditions are met, a nearly arbitrary distribution can be achieved on the substrate, with a minimum achievable feature size $F >> H*(A+B)/B$.

If conditions 2 and 6 are not met, the system will still be usable, although the minimum achievable feature size will increase.

If condition 2 is not met, the correction factor $B/(A+M)$ will be a function of x and y.

If the first part of condition 4 ($A+B >> S$) is not met, the minimum feature size achievable will increase.

If the second part of condition 4 ($S >> ((A+B)/A)*H$) is not met, relative motion R such that ($D >> R > H$) needs to be introduced between the substrate and the mask. This will prevent the structure of the mask from affecting the layer distribution over distances comparable to the scale length H.

If condition 5 is not met, but L<A, the minimum feature size achievable will increase. If L>>A, acceptable results will not be obtainable. If L is in the range from A to 0.1*A, the minimum feature size achievable will increase until it is equal to or greater than A.

Condition 7 will rarely be violated with evaporation or chemical deposition, since the particles are individual molecules. If this condition were violated in a spraying or dusting operation, acceptable results would not be obtainable.

The mask can be made using techniques other than chemical etching, such as laser machining. The mask can be made of woven wire cloth. The mask can be made with taut wires or ribbons stretched on a frame. The taut wires can be parallel, with only the spacing varying to give one-dimensional dodging. The taut wires can be non-parallel to give the desired pattern. More than one set of wires can be used, either coplanar or in different planes. The taut-wire system could have the wire diameter vary, either along the length of individual wires or from wire to wire.

While this invention has been described largely in terms of vapor deposition, it is applicable any where material is desired to be deposited with a controlled thickness distribution to a substrate, with the material travelling ballistically in substantially straight lines. Applications where this occurs are:

1) Vacuum and near-vacuum application of multi-layer and single layer optical filters.
2) Ion-assisted deposition of multi-layer and single layer filters.
3) Chemical vapor deposition at reduced pressures.
4) Paint spraying and dusting applications.

Other embodiments and variations of embodiments of the invention will become apparent to those skilled in the art, and these are intended to be encompassed within the scope of this description and the appended claims.

We claim:

1. A method of forming an interference filter on the inner surface of a glass faceplate for cathode ray tube; the method comprising depositing a layer of source material on the faceplate;
   characterized by providing at least one variable transmission mask between the source material and the faceplate, in a fixed, spaced-apart position relative to the faceplate, and being approximately co-extensive with the faceplate, the variable transmission defined by a plurality of holes varying in one or more of size, shape and spacing and increasing from a minimum at the center of the mask to a maximum within the range of about 70 to 90 percent at the edges of the mask;
   so that during deposition the faceplate is partially shielded from and partially exposed to the source material, the extent of exposure increasing with the mask transmission from the center to the edges of the faceplate, whereby the thickness of the filter increases from the center to the edges of the faceplate.

2. The method of claim 1 in which a plurality of faceplates are each provided with a variable transmission mask, and are moved in circular paths above the source material in order to enhance the uniformity of deposition among the faceplates.

3. The method of claim 1 in which the layer is deposited by vaporizing the source material in the vicinity of the faceplate.

* * * * *

UNITED STATES PATENT AND TRADEMARK OFFICE
CERTIFICATE OF CORRECTION

PATENT NO. : 5,389,397
DATED : February 14, 1995
INVENTOR(S) : Matthew S. Brennesholtz et al It is certified that error appears in the above-indentified patent and that said Letters Patent is hereby corrected as shown below:

On the title page, item [75] Inventor: add inventor --Paul J. Patt, Mt. Kisco, N.Y.--.

Signed and Sealed this

Thirtieth Day of May, 1995

Attest:

BRUCE LEHMAN

*Attesting Officer*   *Commissioner of Patents and Trademarks*